United States Patent [19]

Jongepier

[11] Patent Number: 4,648,127
[45] Date of Patent: Mar. 3, 1987

[54] NOISE DETECTOR

[75] Inventor: Abraham Jongepier, Eindhoven, Netherlands

[73] Assignee: U.S. Philips Corporation, New York, N.Y.

[21] Appl. No.: 747,532

[22] Filed: Jun. 21, 1985

[30] Foreign Application Priority Data

Jul. 23, 1984 [NL] Netherlands .................. 8402320

[51] Int. Cl.$^4$ ............................................. H04B 1/10
[52] U.S. Cl. .................................. 455/212; 455/222; 455/225; 455/303
[58] Field of Search ............... 455/218, 222, 223, 224, 455/225, 212, 213, 305, 303, 306, 311, 312; 307/358; 381/94; 375/102, 104

[56] References Cited

U.S. PATENT DOCUMENTS 4,479,252 10/1984 Souchay et al. .................. 455/223

Primary Examiner—Jin F. Ng
Attorney, Agent, or Firm—Thomas A. Briody; Jack Oisher; William J. Streeter

[57] ABSTRACT

Noise detector for selecting noise pulses from a non-limited FM radio broadcast signal modulated on a carrier, comprising an amplitude detection circuit and a signal comparison circuit. This signal comparison circuit produces a detection signal when its input signal exceeds a threshold level which varies with the average input level of the noise detection, for example, the average field strength. A noise selection being adapted to the human ear and based on the ratio between the noise pulse amplitude and the average input level is realized by means of a logarithmic level detection circuit. The logarithmic conversion therein renders a simple setting of the value of ratio possible, and provides a dynamic compression.

3 Claims, 1 Drawing Figure

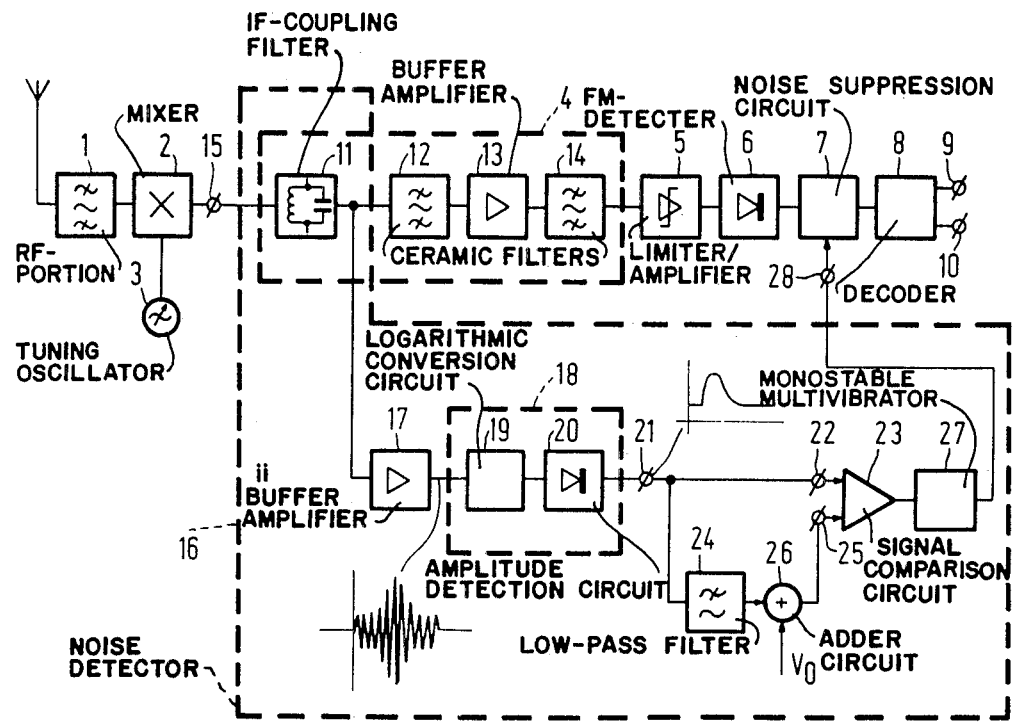

NOISE DETECTOR

BACKGROUND OF THE INVENTION

The invention relates to a noise detector for detecting noise pulses in a non-limited radio receiving signal modulated on a carrier, comprising an amplitude detection circuit and coupled thereto a signal comparison circuit having a signal input and a threshold input. The signal comparison circuit produces a detection signal when the signal at the signal input exceeds a threshold level which depends on a threshold signal at the threshold input, this threshold signal varying with the average input level of the noise detector.

Such a noise detector is disclosed in the United Kingdom Patent Specification No. 2,113,047.

In this patent specification, the prior art noise detector is described for use in a radio receiver whose RF-input signal is applied to the signal input of the signal comparison circuit by an RF-amplifier. The threshold signal at the threshold input of the signal comparison circuit varies, with a certain degree of dependence with the average IF-signal level, through which a noise selection which depends on the average input level or a field strength-dependent noise selection is realized. For that purpose, this threshold signal is supplied from the amplitude detection circuit which is coupled to the IF-receiving section.

In the event of large field strength variations, as occurs, for example, with mobile reception, non-linearities may occur in the prior art noise detector at amplification and/or amplitude detection of signals to be applied to the inputs of the signal comparison circuit. As a result the threshold signal does not vary everywhere within the input dynamic range with the same degree of dependence where the average input level and an unambiguous noise selection criterion is not possible. In addition, for a correct comparison of signals which may vary over a wide amplitude range, the signal comparison circuit must satisfy high requirements for accuracy and linearity.

SUMMARY OF THE INVENTION

It is an object of the present invention to provide a noise detector which is based on a noise selection criterion adapted to the human ear and is not influenced by the width of the dynamic range of the input level and which can be achieved with simple circuits.

According to the present invention, a noise detector of the type described in the opening paragraph is provided with a logarithmic converter circuit, whose output signal varies proportionally to the logarithm of its input signal, which is arranged in cascade with the amplitude detection circuit and forms together therewith a logarithmic level detection circuit, which is connected to an input of the noise detector and supplies the envelope of the logarithm of the input signal to an envelope output. This envelope output is coupled to the signal input as well as to the threshold input of the signal comparison circuit through. A low-pass filter, a fixed threshold value is also applied to this signal comparison circuit for a dc-shift of the threshold level of the signal comparison circuit.

Logarithmic level detection circuits for field strength measurements in FM-radio receivers are known and are, for example, realizable with the aid of an integrated circuit of the type TDA 1576. When such a logarithmic level detection circuit is used in combination with other measures according to the invention, a constant ratio is obtained between the average input level or the average field strength of a radio receiving signal and the input signal amplitude at which noise detection occurs. As a result a noise detection is effected based on the audibility of the noise in the useful signal, based on the S/N ratio, N representing the audible interference due to the noise pulses. The threshold level can then be adjusted in a simple way to the audibility of the noise, by means of the fixed threshold value.

The logarithmic signal conversion in the logarithmic convertor circuit also has a dynamic compression effect, so that the requirements for the accuracy and the linearity of the circuits subsequent to the logarithmic level detection circuit may be much lower than with a prior art noise detector. In this way, an unambiguous noise selection is possible, independent of the magnitude of the input signal dynamics, with the aid of simple and inexpensive circuits.

In a preferred embodiment of the noise detector, an IF-coupling filter tuned to an FM-receiver intermediate frequency which is connected between the input of the noise detector and the logarithmic level detection circuit.

When this preferred embodiment is used in an FM-radio receiver, advantageous use is made of the selectivity of the IF-coupling filter for detection of those noise pulses which disturb the desired radio receiving signal.

According to a further preferred embodiment, in a noise detector of the present invention, the dc-shift of the threshold level of the signal comparison circuit due to the fixed threshold value at the input of the logarithmic converter circuit corresponds to a factor of the order of magnitude of two.

In this embodiment, detection of amplitude disturbances due to certain receiving conditions, for example, multi-path reception, is prevented and predominantly motor noise pulses are detected.

BRIEF DESCRIPTION OF THE DRAWING

The FIG. 1 shows a noise detector in accordance with the present invention.

The invention will now be described in greater detail by way of example with reference to the sole FIGURE shown in the accompanying drawing.

DESCRIPTION OF THE PREFERRED EMBODIMENT

This FIGURE shows a noise detector according to the invention in the FM-section of an existing car radio of the Philips type 22AC 820. This car radio comprises, coupled one after the other to an aerial input, an RF-portion 1, a mixer stage 2 to which oscillator mixing signals are applied from a tuning oscillator 3, an IF-portion 4, a limiter/amplifier 5, an FM-detector 6, a noise suppression circuit 7, a stereo decoder/audio processing portion 8 and stereophonic left and right audio outputs 9 and 10.

From the RF-radio receiving signal and desired RF-FM signal is selectively applied by a first selection in the RF-portion 1 to the mixer stage 2, in which frequency conversion to an FM-intermediate frequency of 10.7 MHz is effected. IF-selection and amplification are effected in the IF-portion 4. This IF-portion comprises a cascade arrangement, in succession, an IF-coupling filter 11, a first ceramic filter 12, a buffer amplifier 13 and a second ceramic filter 14. The IF-coupling filter 11 predominantly has for its object to couple to a signal at the mixer stage 2 and at the same time provides a certain amount of selectivity. In addition, the IF-coupling filter 11 forms part of a noise detector 16 which will be described hereinafter. The actual IF-selectivity is realized by means of the ceramic filters 12 and 14. After amplification and limitation, IF-detection is effected, and in the noise suppression circuit 7 interference is removed from the FM-modulation signal or the stereo multiplex signal. For this purpose the noise suppression circuit 7 may be realized with the aid of an integrated circuit of the type TDA 1001, and comprises a hold circuit (not shown), in which in known manner the signal level is kept constant during a certain period of time at the occurrence of a detection signal at a trigger input 28. Thereafter, dematrixing of the stereo multiplex signal is effected and a further audio signal processor operation takes place, and the desired stereophonic audio signals are available at/the outputs 9 and 10.

The receiver described so far is known, for example, from for the manual of said car radio and a further detailed description of the signal processing operation and the manner of noise suppression is not necessary for an understanding of the invention.

The noise detector 16, according to the present invention has an input 15, which is coupled to the output of the mixer stage 2 and at which the desired and non-limited radio receiving signal being FM-modulated on the 10.7 MHz intermediate frequency carrier, is available. After having been coupled through the IF-coupling filter 11, this FM-modulated non-limit radio receiving signal is processed in a buffer amplifier 17 and applied to a logarithmic level detection circuit 18. In a known manner, this level detection circuit forms the logarithm of the envelope of the radio receiving signal and for that purpose comprises a cascade arrangement of a logarithmic conversion circuit 19, whose output signal varies proportionally to the logarithm of its input signal, and an amplitude detection circuit 20, which supplies the envelope of this output signal at an envelope output 21. The logarithmic level detection circuit 18 can be achieved by use of an integrated circuit of the type TDA 1576. For a further description of the signal processing operation effected therein, reference is made to the manual of this integrated circuit such as is published in "Philips Datahandbook IC1 01-83-"Integrated Circuits", Part 1, January 1983.

The envelope output 21 is coupled to a signal comparison circuit 23 through a signal input 22 and also to a threshold input 25 of the signal comparison circuit 23 by a low-pass filter 24. The low-pass filter 24 has an adequately low cut-off frequency to furnish in its output signal a realiable measure of the average value of the envelope at the envelope output 21, and consequently, a measure of the average field strength. An adder circuit 26 in which a fixed threshold value $V_o$ is added to the output signal of the low-pass filter 24 is arranged between the low-pass filter 24 and the threshold input 25. The sum signal thus produced determines the threshold level of the signal comparison circuit 23. If the envelope amplitude at the signal input 22 exceeds the amplitude of this sum signal, the signal comparison circuit 23 applies a detection signal to a monostable multivibrator 27 which is triggered thereby and applies a trigger signal to the trigger input 28 of the noise suppression circuit 7, which effects a noise pulse suppression.

Exceeding of the threshold level described above occurs when the instantaneous amplitude of the non-limited radio receiving signal, FM-modulated on the 10.7 MHz IF-carrier at the input 15 of the noise detector 16, in response to a noise pulse, exceeds a value which corresponds to the product of the average input level or field strength of this radio receiving signal and a fixed value determined by the fixed threshold value $V_o$. If this fixed threshold value $V_o$ corresponds to, 6 dB, for example, a detection signal is regenerated when instantaneous amplitude of the input signal of the noise detector 16 becomes twice the average value. The noise selection criterion thus obtained is therefore based on the ratio between the noise amplitude and the average field strength and is thus adapted to the human ear, which, at a fixed ratio value, hears the same noise impression independent of the actual noise amplitude and/or the actual value of the average field strength. Because of the logarithmic conversion, this ratio value is adjustable in a simple way to a correct value by means of the fixed threshold value $V_o$. Selecting the threshold value of $V_o$ to have a value in the order of magnitude of the above-mentioned example prevents the noise detector from responding to amplitude disturbances caused by certain receiving conditions, such as multi-path reception, cross-modulation, etc. In addition, as previously described, this logarithmic conversion effects a high degree of dynamic compression, as a result of which a wide input dynamic range is converted into a comparatively small amplitude variation range and an unambiguous noise selection is possible, using simple circuits.

In a practical embodiment, an integrated circuit of the type TDA 1576 was used for the logarithmic level detection circuit 18, operational amplifiers of the type NE 5535 for an embodiment of the low-pass filter 24 and the adder circuit 26, a zener diode of the type 2V6, for generating a constant threshold value $V_o$, an operational amplifier of the type LM 119 for the signal comparison circuit 23 and an integrated circuit of the type HEF 4538 for the monostable multivibrator 27.

It will be obvious that alternative embodiments, based on the same inventive idea, are feasible. Thus, it is conceivable to couple the input of the noise detector 16 to the aerial input or to an output of the RF-section 1 and to adapt the further circuits of the noise detector thereto and/or to omit the IF-coupling filter 11. It is alternatively conceivable to apply the fixed threshold value $V_o$ with the inverse sign to the signal input 22 of the signal comparison circuit 23 or to realize different signal combinations which have a similar effect for their object.

It should be noted that the location of noise suppression in the signal path of the receiver is not relevant to the invention; it is important for correct noise suppression that the delay in the signal path between the input of the noise detector 16 and the location of noise suppression is equal to the delay in generating the detection signal. In the embodiment shown, it is therefore very feasible to have the noise suppression effected between the two ceramic filters 12 and 14.

What is claimed is:

1. A noise detector for selecting noise pulses from a non-limited FM radio broadcast signal modulated on a carrier comprising:
   a logarithmic level detection circuit including a logarithmic converter circuit having an input for receiving said modulated signal, an output for producing an output signal proportional to the logarithm of its input signal, and an amplitude detection circuit having an input connected to said output of said logarithmic converter circuit, and an output for supplying an envelope of the logarithm of said modulated signal;

a low pass filter having its input connected to said output of said amplitude detection circuit and an output for producing a signal representing the average value of said envelope;

an adder circuit having one input connected to said output of said low pass filter and a second input for receiving a fixed threshold value, said adder circuit adding said fixed threshold value to said average value, effecting a DC shift of said signal representing the average value at an output of said adder circuit;

a signal comparison circuit having a signal input and a threshold input and an output, said signal input being connected to said output of said amplitude detection circuit, said threshold input being connected to said output of said adder circuit for receiving a threshold level signal, said signal comparison circuit supplying a detection signal when a signal amplitude value at said signal input exceeds the amplitude value of said threshold level signal.

2. A noise detector as claimed in claim 1, further comprising an IF-coupling filter tuned to an FM intermediate frequency having an input for receiving said modulated signal and an output connected to said logarithmic level detection circuit input.

3. A noise detector as claimed in claim 1 wherein said DC shift of said signal at said adder output corresponds to a factor of substantially two.

* * * * *